(12) United States Patent
Patelmo et al.

(10) Patent No.: US 6,444,526 B1
(45) Date of Patent: Sep. 3, 2002

(54) SIMPLIFIED PROCESS FOR DEFINING THE TUNNEL AREA IN NON-ALIGNED, NON-VOLATILE SEMICONDUCTOR MEMORY CELLS

(75) Inventors: Matteo Patelmo, Bernareggio; Giovanna Dalla Libera, Monza; Nadia Galbiati, Seregno; Bruno Vajana, Bergamo, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/419,403

(22) Filed: Oct. 14, 1999

(30) Foreign Application Priority Data

Oct. 15, 1998 (EP) ............................................. 98830614

(51) Int. Cl.⁷ ............................................. H01L 21/336

(52) U.S. Cl. ..................... 438/264; 438/142; 438/257; 438/258

(58) Field of Search ................. 438/142, 257, 438/258, 264

(56) References Cited

U.S. PATENT DOCUMENTS 5,066,992 A 11/1991 Wu et al. .................. 357/23.5
5,793,081 A 8/1998 Tomioka et al. ............ 257/319

FOREIGN PATENT DOCUMENTS

EP 0676811 A1 11/1995
EP 0782196 A1 2/1997

*Primary Examiner*—Eddie Lee
*Assistant Examiner*—N. Drew Richards
(74) *Attorney, Agent, or Firm*—Lisa K. Jorgenson; Robert Iannucci; Seed IP Law Group PLLC

(57) ABSTRACT

A simplified non-DSCP process for the definition of the tunnel area in nonvolatile memory cells with semi-conductor floating gates is presented. The memory cells are non-aligned and are incorporated in a matrix of cells and have associated control circuitry. In additional, to each cell a selection transistor is associated. The process includes at least the following phases: growth or deposition of a dielectric layer of gate of the sensing transistor and of the cells; tunnel mask for defining the area of tunnel; cleaning etching of the dielectric layer of gate in the area of tunnel up to the surface of the semiconductor; and growth of tunnel oxide. Advantageously, the tunnel mask is extended above the region occupied by the selection transistor.

8 Claims, 2 Drawing Sheets

SIMPLIFIED PROCESS FOR DEFINING THE TUNNEL AREA IN NON-ALIGNED, NON-VOLATILE SEMICONDUCTOR MEMORY CELLS

TECHNICAL FIELD

The present invention relates to a simplified process for the definition of a tunnel area in non-volatile semiconductive non-self-aligning memory cells.

BACKGROUND OF THE INVENTION

The invention relates in particular, but not exclusively, to the production of EEPROM FLOTOX memory cells and the following description is made with reference to this field of application with the sole objective of simplifying its explanation.

It is well known that EEPROM type memory cells are formed by a field effect transistor equipped with a floating gate capacitively coupled to a control gate terminal. Such a floating gate transistor is connected in series to a selection transistor.

The floating gate is formed by a first layer of polysilicon, so-called poly1; while the control gate is formed by an overlaying second layer of polysilicon, so called poly2.

While in the memory cells the layers of poly1 and poly2 are separated by an intermediate interpoly dielectric layer, the selection transistor gate is formed by only one layer of poly.

FIGS. 1 and 1a show from above and in cross-section, respectively a portion of a semi-conductive sublayer 10 including a single conventional EEPROM memory cell 1 including a field effect transistor 2 equipped with a floating gate 3 capacitively coupled to a control gate terminal 4. The floating gate transistor 2 is connected in series to a selection transistor 5.

The floating gate 3, in which the charges are stored, is formed by the first layer of poly1, while the gate control 4 is formed by the second layer of poly2.

A thin layer of tunnel oxide 6, having a thickness of about 80 Angstroms, is provided between the floating gate 3 and the semi-conductive sublayer 10. Electrical charges pass via this tunnel oxide 6 due to the Fowler-Nordheim effect, during the memory cell 1 programming phase.

A diffused area formed in the sublayer 10 and partially below the region of the gate, is destined for a capacitor implant which helps to form a pocket of electrons which allows for an efficient injection by the Fowler-Nordheim tunnel effect.

In the newest generation technology, the tunnel area 6 is defined by means of a stripe which is situated in part under the floating gate 3, and which represents the actual tunnel area 6, and partly on the outside in the direction of the selection transistor 5. The portion extending outside the floating gate is indicated with 7 in FIG. 1a. This arrangement reduces the lithographic and tunnel area etching criticalness, as shown in FIGS. 1 and 1a. written paragraph:

This known solution presents a problem because an edge or step 11 is created in the layer of thick oxide 12 between the selection transistor 5 and the floating gate 3. This step 11 notably complicates the removal of the thick layer of oxide 12 necessary for following phases of the non-Double Short Circuited Polysilicon (DSCP) non-self-aligned process for the production of EEPROM memories. Typically after the definition of the floating gate, that is of the layer of poly1, the thick oxide 12 is etched to then make the gate oxides of the circuitry associated with the cell matrix. This etching of thick oxide 12 must reach the surface of the semi-conductor 10 without damaging it.

Nevertheless, in the presence of disuniformities of the oxide itself, such as those due to the step 11, the etching phase can be problematic because there is the risk of overetching the thick oxide 12 in some areas in order to be able to remove it completely in others.

SUMMARY OF THE INVENTION

An embodiment of the present invention includes a non-DSCP and non-selfaligned process flow of a simplified type having characteristics such as to permit the production of semi-conductive FLOTOX EEPROM type memory cells having a uniform layer of oxide on all the active areas even after the growth of the tunnel oxide.

In embodiments of the invention, the tunnel mask is designed in such a way as to remove all the thick oxide except that in the sensing transistor area, that is to say in the portion of memory cell comprised between the capacitor plant and the source diffusion. This allows for a uniform oxide on all of the active areas which can be removed in an easier way than in the prior art.

A simplified non-DSCP process for defining the tunnel area in non-volatile memory cells with semi-conductive floating gate which are non-aligned and incorporated in a cell matrix with associated control circuitry, to each cell a selection transistor being associated, is described. The process includes growing or depositing a gate dielectric layer for the sensing transistor and for the cell; forming a tunnel mask that extends above the region occupied by the selection transistor for defining the tunnel area; cleaning etching of the gate dielectric layer in the tunnel area up to the surface of the semi-conductor; and growing the tunnel oxide.

The features and the advantages of the process according to the invention will be seen from the description, following herein, of an indicative and not limiting example of embodiment given with reference to the attached drawings.

DETAILED DESCRIPTION

The phases of the process and the structures described as follows do not form a complete process flow for the manufacture of integrated circuits. Discussion of steps well known to those skilled in the art have been abbreviated or eliminated for brevity. The present invention can be put into practice together with the manufacturing techniques of integrated circuits actually used in the field at the moment. Only the commonly used phases of the process which are necessary for the comprehension of the present invention are included. The figures representing cross sections of portions of an integrated circuit during its manufacturing are not drawn in scale, but are designed in such a way as to illustrate the important features of the invention.

Figure 2:
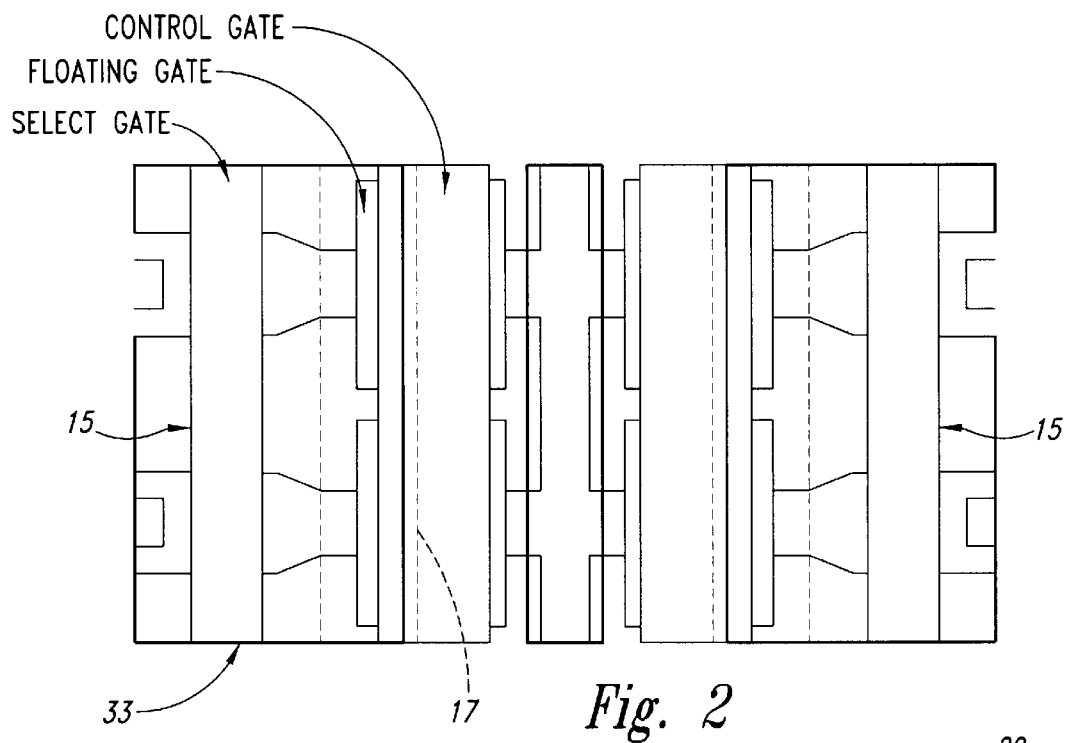
FIG. 2 is a layout view of a portion of a semiconductor integrated circuit comprising at least one pair of EEPROM memory cells produced according to an embodiment of the present invention.
Figure 2A:
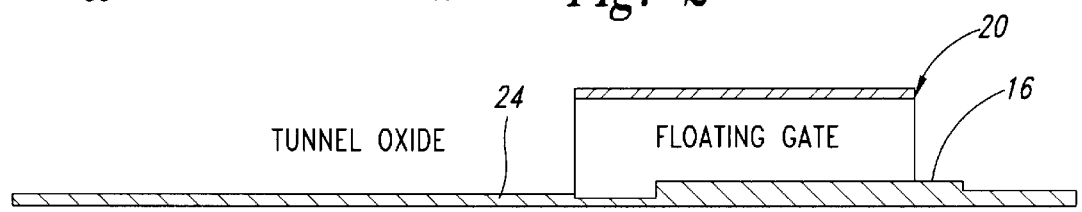
FIG. 2a is a cross-sectional view of the cell illustrated in FIG. 2.
Figure 2B:
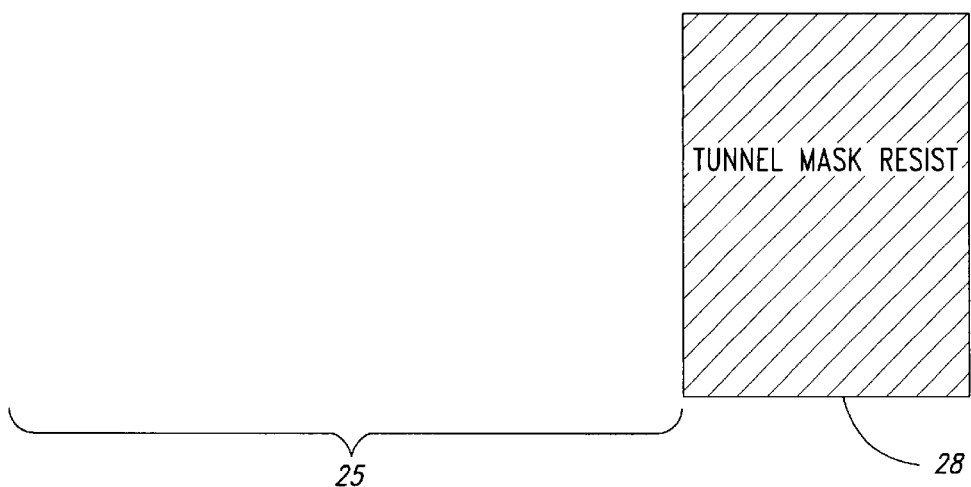
FIG. 2b is a top view of a tunnel mask photoresist used to produce one of the cells of FIG. 2.

With particular reference to the examples in FIGS. 2, 2a, and 2b, the process steps according to an embodiment of the invention which lead to the production of non-selfaligned EEPROM memory cells 20 is shown.

Figure 1:
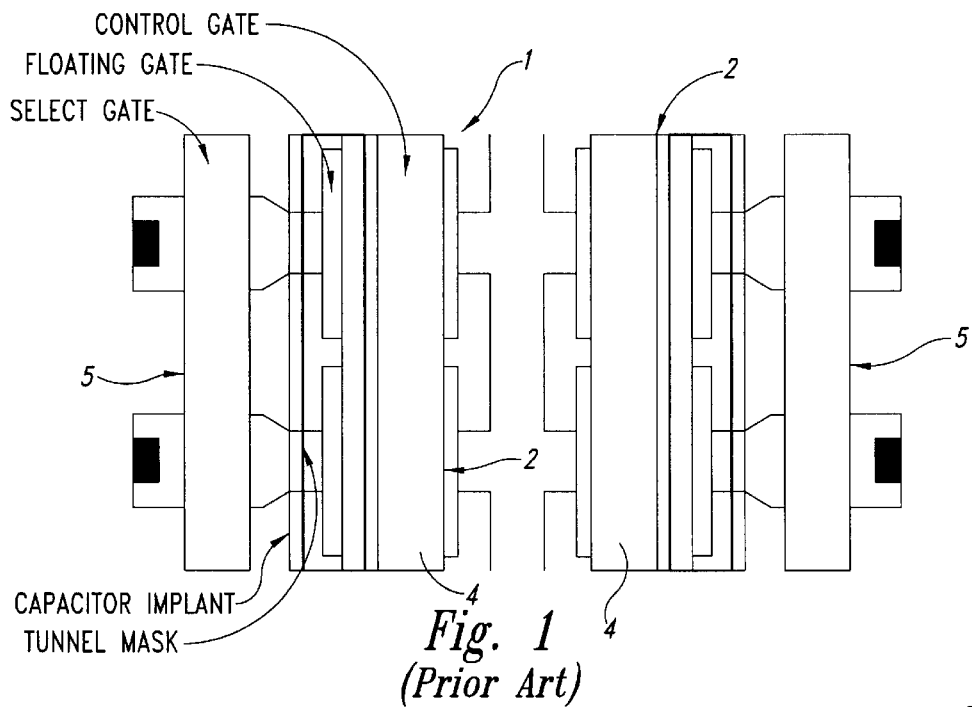
FIG. 1 is a layout view of a portion of an integrated circuit on a semiconductor comprising at least one pair of EEPROM memory cells of the known type produced according to a non-DSCP process each one with an associated selection transistor.
Figure 1A:
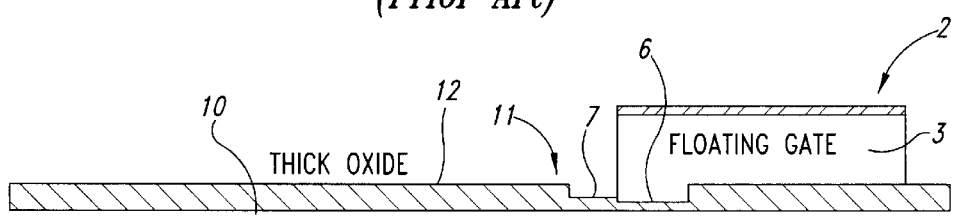
FIG. 1a is a cross-sectional view of the cell shown in FIG. 1.
Figure 1B:
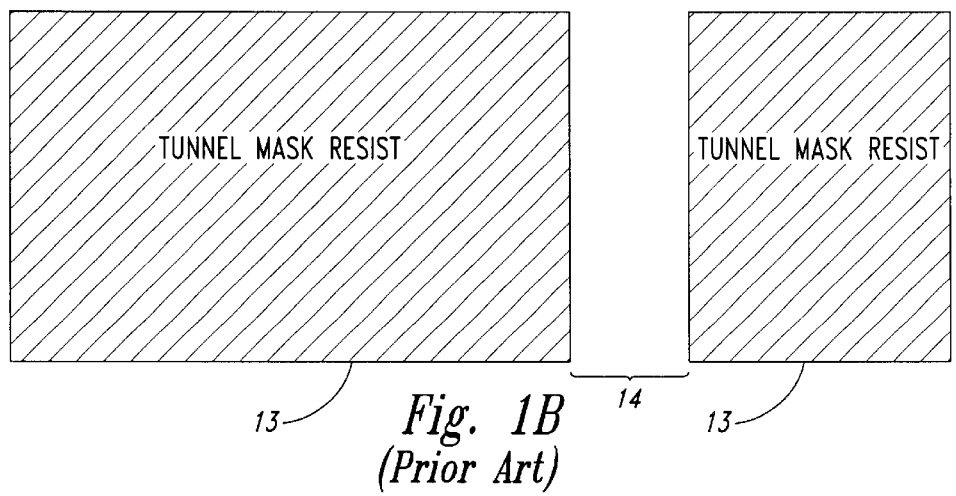

A cell 20 according to this embodiment, with a related selection transistor 15, is obtained by means of a CMOS process of the non-DSCP and non-self-aligned type in which, starting from a P type sublayer, the following initial steps are carried out: masking for the capacitor implant 17 and respective implant; growth or deposition of a dielectric layer 16 which will form the gate dielectric of the sensing transistor and of the cell 20; tunnel mask 33 to define the tunnel area; cleaning etching of the gate dielectric layer 16 in the tunnel area to the surface of the semi-conductor; and growth of the tunnel oxide 24 over a much larger portion of the semiconductor than the cell shown in FIGS. 1 and 1b.

Advantageously, according to embodiments of the invention, the tunnel mask 33 is designed in a different way with respect to the prior art.

More in particular, the tunnel mask 33 according to these embodiments is extended above the region occupied by the selection transistor 15 in such a way as to allow for the removal of all the thick oxide 16 except for that which is in the region of the sensing transistor, that is to say, in the portion of memory cell comprised between the capacitor implant 17 and the source diffuision.

In the embodiments shown in FIGS. 2, 2a, and 2b, the tunnel mask 33 covers a much larger area than that in the prior art shown in FIGS. 1 and 1b. Because, for instance, a positive photoresistive layer was used with a dark field tunnel mask, the photoresist in the area beyond the mask, for instance tunnel mask resist area 28 shown in FIG. 2b covers the thick oxide layer 16 shown in FIG. 2a. When all of the thick oxide layer 16 in the etching area 25 is removed, the areas covered by the tunnel mask resist 28 are preserved. Any proper combination of positive and negative photoresists, with clear or dark field masks can be used to create the tunnel mask resist 28 only in the area near the floating gate of the floating gate transistor 20, as is known in the art.

This allows for a uniform layer of oxide on all the active areas. Such layer of oxide can be removed in a very simple way, without the problem of the step 11 of oxide as in the prior art.

Essentially, the process steps for defining the area of tunnel are compatible with those used by the prior art. However, during the step of the removal of the thick oxide 16 phase, such oxide is removed from everywhere except in the area of the sensing transistors of the EEPROM cells.

The solution according to embodiments of the invention means that, after the growth of the tunnel oxide, a uniform oxide on all active areas can be obtained, though excluding the active areas of the sensing transistors. This uniformity is essential for a correct removal of the oxide which occurs in following steps of the processes typically before the growth of the oxides of the circuitry.

The active area of the circuitry undergoes one etching of oxides in addition with respect to the usual technique. This disadvantage, though, is mitigated by the fact that such etching can be exactly calibrated on the uniform thick layer in order not to excessively damage the active area itself.

The modification to the tunnel mask proposed by the present invention does not worsen possible problems of disalignment between the masks with respect to the solutions of prior art. The possible presence of a residual step in the portion of semiconductor comprised between two cells 20 does not create problems of any sort.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. In a memory matrix that has associated control circuitry, a process to define a tunnel area in non-DSCP, non-volatile memory cells having semi-conductive floating gates which are non-aligned, each memory cell being associated with a respective selection transistor, the process comprising at least the following phases:

forming a gate dielectric layer on a semiconductor substrate for one of the selection transistors and for its associated memory cell;

using a tunnel mask to define the tunnel area that extends from an area on which a control gate of the one selection transistor will be formed to an area on which will be formed a floating gate of the memory cell associated with the one selection transistor;

etching the gate dielectric layer in all of the tunnel area to a surface of the semiconductor substrate;

growing a tunnel oxide layer on the surface of the semiconductor substrate in the tunnel area;

forming a floating gate for the memory cell associated with the one selection transistor with at least a portion of the floating gate disposed over the tunnel oxide; and using the tunnel oxide to form a gate oxide under the control gate of the related selection transistor.

2. The process according to claim 1 wherein said tunnel area extends from a capacitor implant region of the associated memory cell and through an entire active area of the selection transistor.

3. The process according to claim 1 wherein one layer of uniform oxide is present on active areas of the selection transistor and the associated memory cell except for some of the area of the associated memory cell after the growth of the tunnel oxide.

4. A process for producing non-volatile memory devices including a memory cell and a related selection transistor, the process comprising:

growing a thick oxide layer on a semiconductor substrate;

masking the semiconductor substrate in a tunnel area that extends from a portion of the semiconductor substrate where the memory cell will be formed to a portion of the semiconductor substrate on which a control gate of the related selection transistor will be formed;

removing the thick oxide layer in the tunnel area;

growing a tunnel oxide on the semiconductor substrate in the tunnel area;

forming a floating gate for the memory cell with at least a portion of the floating gate disposed over the tunnel oxide; and using the tunnel oxide to form a gate oxide under the control gate of the related selection transistor.

5. The process of claim 4 further comprising forming a capacitor implant in the semiconductor substrate for the memory cell, the capacitor implant formed within the tunnel area.

6. The process of claim 5 wherein the capacitor implant is formed prior to growing the thick oxide layer.

7. The process of claim 1 wherein using a tunnel mask includes using a tunnel mask to define a tunnel mask resist that covers a portion of the gate dielectric layer that is not to be etched and leaves uncovered the gate dielectric layer in the tunnel area.

8. The process of claim 4 wherein masking the semiconductor substrate includes using a tunnel mask resist that covers a portion of the gate dielectric layer that is not to be etched and leaves uncovered the gate dielectric layer in the tunnel area.

* * * * *